US010062767B2

(12) United States Patent
Hong et al.

(10) Patent No.: US 10,062,767 B2
(45) Date of Patent: Aug. 28, 2018

(54) MEMORY CELL AND FABRICATION METHOD THEREOF (71) Applicants: Semiconductor Manufacturing International (Shanghai) Corporation, Shanghai (CN); Semiconductor Manufacturing International (Beijing) Corporation, Beijing (CN)

(72) Inventors: Bo Hong, Shanghai (CN); Shuai Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/407,308

(22) Filed: Jan. 17, 2017

(65) Prior Publication Data

US 2017/0222017 A1    Aug. 3, 2017

(30) Foreign Application Priority Data

Feb. 3, 2016    (CN) .......................... 2016 1 0079607

(51) Int. Cl.
*H01L 21/8238* (2006.01)
*H01L 21/336* (2006.01)
(Continued)

(52) U.S. Cl.
CPC ...... *H01L 29/66492* (2013.01); *H01L 21/266* (2013.01); *H01L 21/28273* (2013.01);
(Continued)

(58) Field of Classification Search
CPC ......... H01L 29/66492; H01L 29/66825; H01L 29/788; H01L 29/7835; H01L 27/11517;
(Continued)

(56) References Cited

U.S. PATENT DOCUMENTS

2002/0064898 A1    5/2002  Adachi et al.
2003/0232472 A1   12/2003  Wu
(Continued)

OTHER PUBLICATIONS

European Patent Office (EPO) The Partial European Search Report for 17152904.3 dated Jun. 29, 2017 16 Pages.
(Continued)

*Primary Examiner* — Hsien Ming Lee
(74) *Attorney, Agent, or Firm* — Anova Law Group, PLLC (57) ABSTRACT Memory cells and fabrication methods thereof are provided. An exemplary method includes providing a substrate having a well region; forming a select gate structure, a floating gate structure and a dummy gate structure on a surface of the well region; forming a first lightly doped region, a second lightly doped region and a third lightly doped region in the well region, the first lightly doped region and the second lightly doped region being at two sides of the select gate structure respectively, the second lightly doped region being in between the select gate structure and the floating gate structure, and the third lightly doped region being in between the floating gate structure and the dummy gate structure; and forming bit line region in the first lightly doped region and a source region in the third lightly doped region, the source region being enclosed by the third lightly doped region.

20 Claims, 5 Drawing Sheets (51) Int. Cl.
  *H01L 29/788* (2006.01)
  *H01L 29/66* (2006.01)
  *H01L 21/266* (2006.01)
  *H01L 27/11519* (2017.01)
  *H01L 27/11524* (2017.01)
  *H01L 29/78* (2006.01)
  *H01L 21/28* (2006.01)
  *H01L 29/423* (2006.01)

(52) U.S. Cl.
  CPC .. *H01L 27/11519* (2013.01); *H01L 27/11524* (2013.01); *H01L 29/42328* (2013.01); *H01L 29/6659* (2013.01); *H01L 29/66545* (2013.01); *H01L 29/66825* (2013.01); *H01L 29/788* (2013.01); *H01L 29/7833* (2013.01); *H01L 29/7835* (2013.01); *H01L 29/7881* (2013.01)

(58) Field of Classification Search
  CPC ......... H01L 27/11541; H01L 29/42324; H01L 29/42344; H01L 29/42332
  USPC ......................................... 438/201, 211, 257
  See application file for complete search history.

(56) References Cited

U.S. PATENT DOCUMENTS

2006/0138463 A1   6/2006   Kim et al.
2015/0084110 A1   3/2015   Chen

OTHER PUBLICATIONS

The European Patent Office (EPO) The Extended European Search Report for 17152904.3 dated Oct. 19, 2017 14 Pages.

MEMORY CELL AND FABRICATION METHOD THEREOF

CROSS-REFERENCES TO RELATED APPLICATIONS

This application claims the priority of Chinese patent application No. 201610079607.2, filed on Feb. 3, 2016, the entirety of which is incorporated herein by reference.

FIELD OF THE INVENTION

The present invention generally relates to the field of semiconductor manufacturing technology and, more particularly, relates to memory cells and fabrication processes thereof.

BACKGROUND

Multiple time programmable (MTP) memory are a common type of non-volatile memory (NVM). Because the manufacturing of the MTP NVM is simple; and the production cost is relatively low, the MTP NVM have gained wide applications. For example, the MTP NVM are used in many apparatus, such as embedded systems, PCs and peripheral components, telecom exchanges, cellular phones and internet, etc.; and used to store information including voice and image data, etc.

A memory cell of a double-gate MTP NVM includes a substrate having a well region; a select gate and a floating gate formed in the well region; a source region and a bit line region formed in the well region in the substrate at the two sides of the select gate and the floating gate; and a lightly doped region formed in the well region in the substrate between the select gate and the floating gate. The source region, the bit line region and the lightly doped region have a same doping type. The doping type of the source region, the bit line region and the lightly doped region is opposite to that of the well region.

However, the performance of the memory cells of the existing MTP NVM is not stable. The disclosed device structures and methods are directed to solve the stability problem and other problems in the art.

BRIEF SUMMARY OF THE DISCLOSURE

One aspect of the present disclosure includes a method for fabricating a memory cell. The method includes providing a substrate having a surface; forming a well region in the surface of the substrate; forming a select gate structure, a floating gate structure and a dummy gate structure on the surface of the substrate in the well region with the select gate structure and the dummy gate structure being at two sides of the floating gate structure, respectively; forming a first lightly doped region, a second lightly doped region and a third lightly doped region in the well region with the first lightly doped region and the second lightly doped region being at two sides of the select gate structure respectively, the second lightly doped region being in between the select gate structure and the floating gate structure, and the third lightly doped region being in between the floating gate structure and the dummy gate structure; forming sidewalls on side surfaces of the select gate structure, the floating gate structure and the dummy gate structure and portions of the surface of the substrate; and forming a bit line region in the first lightly doped region and a source region in the third lightly doped region, the source region being enclosed by the third lightly doped region.

Another aspect of the present disclosure includes a memory cell. The memory cell includes a substrate having a surface; a well region formed in the surface of the substrate; a select gate structure, a floating gate structure and a dummy gate structure formed on the surface of the substrate in the well region with the floating gate structure and the dummy gate structure being at two sides of the floating gate structure, respectively; a first lightly doped region, a second lightly doped region and a third lightly doped region formed in the well region with the first lightly doped region and the second lightly doped region being at two sides of the select gate structure respectively, the second lightly doped region being in between the select gate structure and the floating gate structure and the third lightly doped region being in between the floating gate structure and the dummy gate structure; a bit line region formed in the first lightly doped region; and a source region formed in the third lightly doped region with the source region being enclosed by the third lightly doped region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
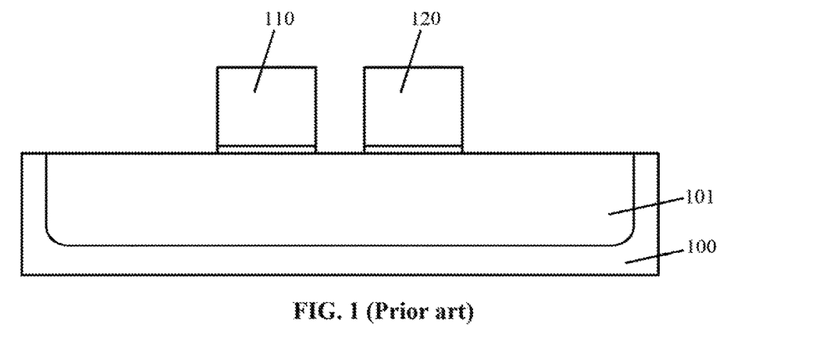
FIGS. 1-3 illustrate structures corresponding to the certain stages of the existing fabrication process of a memory cell of the MTP NVM.
Figure 2:
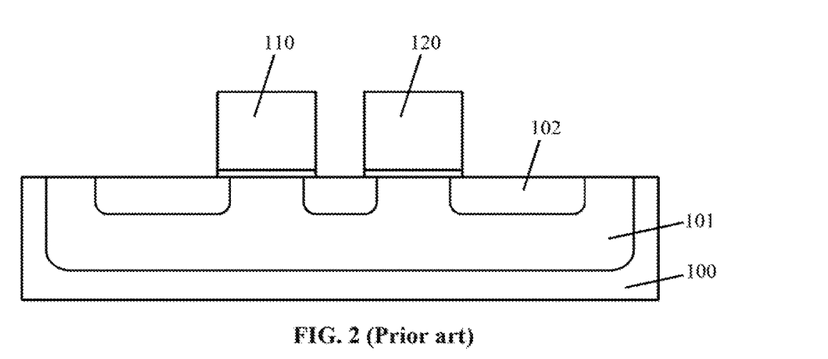
Figure 3:
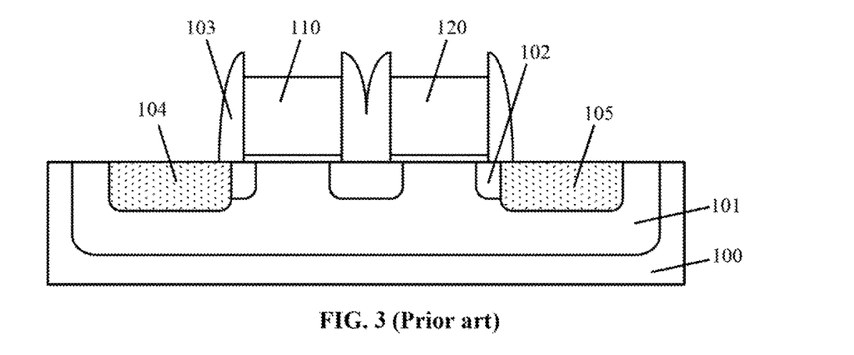

FIGS. 1-3 illustrate structures corresponding to the certain stages of an existing fabrication process of a memory cell of the MTP NVM. As shown in FIG. 1, the process includes providing a substrate 100 having a well region 101; and forming a select gate 110 and a floating gate 120 on the surface of the substrate 100 in the well region 101, respectively.

Further, as shown in FIG. 2, after forming the select gate 110 and the floating gate 120, lightly doped regions 102 are formed in the well region 101 at the two sides of the select gate 110 and the floating gate 120, and in the well region 101 between the select gate 110 and the floating gate 120. The select gate 110 and the floating gate 120 are used as a mask for forming the lightly doped regions 102.

Further, as shown in FIG. 3, after forming the lightly doped regions 102, sidewalls 103 are formed on the side surfaces of the select gate 110 and the floating gate 120. The sidewalls 103 cover the surface of the lightly doped region 102 between the select gate 110 and the floating gate 120.

After forming the sidewalls 103, a bit line region 104 is formed in the substrate 100 in the well region 101 at the side of the select gate 110; and a source region 105 is formed in the substrate 100 in the well region 101 at the side of the floating gate 120. The select gate 110, the floating gate 120 and the sidewalls 102 are used as a mark for forming the bit line region 104 and the source region 105.

When the memory cell is in operation, positive bias voltages are applied on the bit line region 104 and the well region 105; and a negative bias voltage is applied on the source region 105. Thus, a potential difference is generated between the well region 101 and the source region 105. However, the source region 105 has only the portion close to the side of the floating gate 120 surrounded by the lightly doped region 102; and the portion of the source region 105 away from the floating gate 120 is not surrounded by the lightly doped region 102, and may directly connect with the well region 101. Because the doping concentration of the source region 105 is relatively high; and the doping concentration of the well region 101 is relatively low; and the doping type of the source region 105 is opposite to the doping type of the well region 101, under the condition that there is a potential difference between the well region 101 and the source region 105, the contact interface between the source region 105 and the well region 101 is easy to be broken down. Accordingly, a leakage current is generated from the contacting source region 105 and well region 101. Such a leakage current reduces the performance of the memory cell; and deteriorates the reliability of the memory cell.

Figure 10:
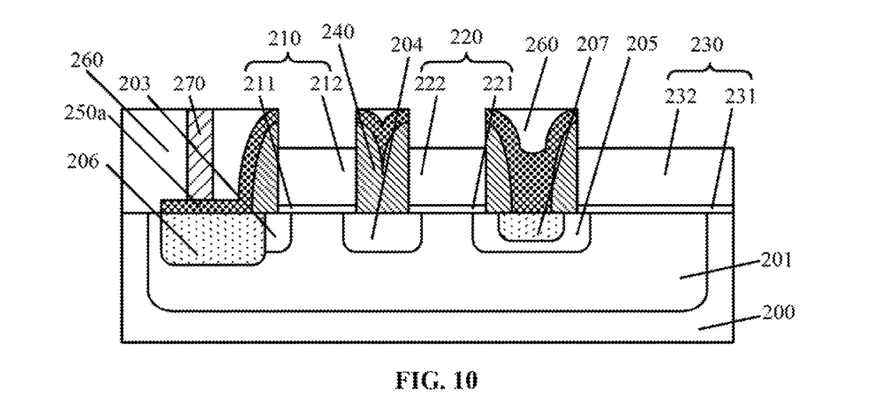
Figure 11:
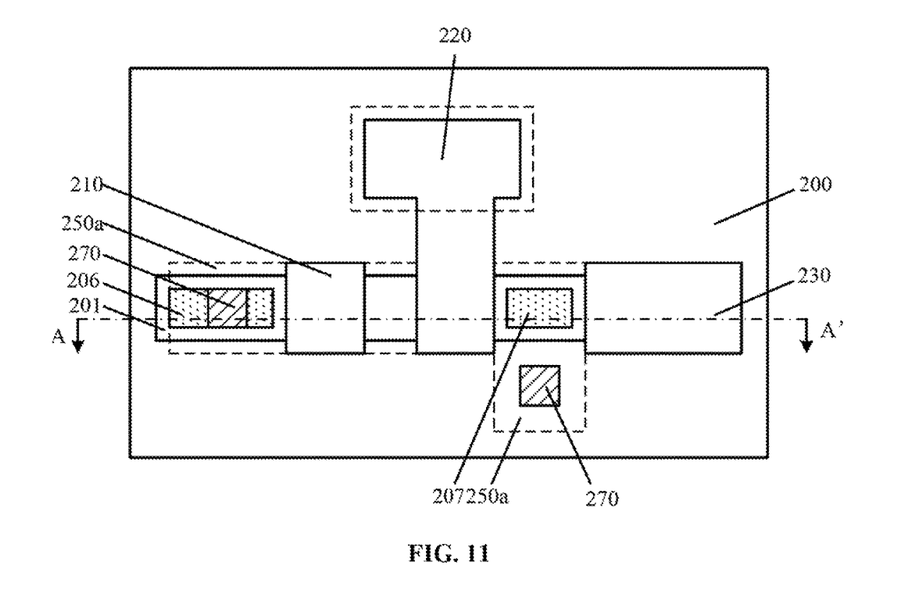
Figure 12:
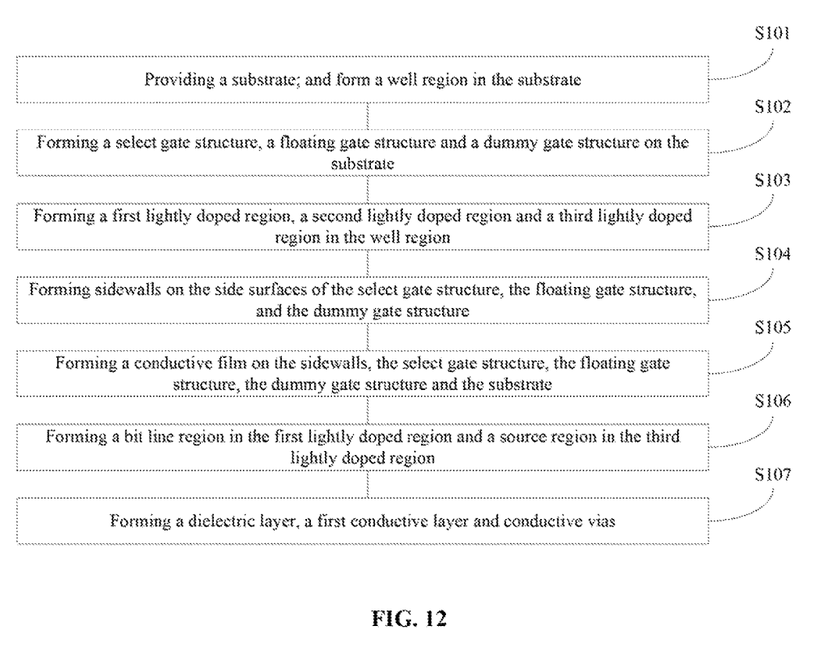
FIG. 12 illustrates an exemplary fabrication process of a memory cell consistent with the disclosed embodiments.

The present disclosure provides an improved fabrication method of a memory cell. FIG. 12 illustrates an exemplary fabrication process of a memory cell consistent with the disclosed embodiments. FIGS. 4-11 illustrate structures corresponding stages of the exemplary fabrication process.

Figure 4:
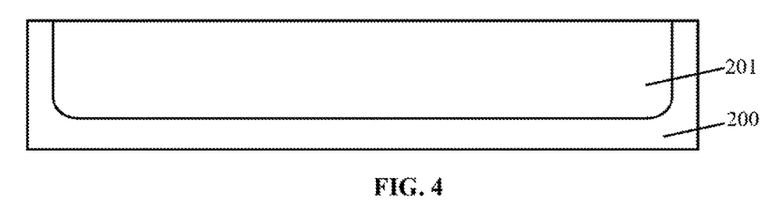
FIGS. 4-11 illustrate semiconductor structures corresponding to certain stages of an exemplary fabrication process of a memory cell consistent with the disclosed embodiments.

As shown in FIG. 12, at the beginning of the fabrication process, a substrate with certain structures is provided (S101). FIG. 4 illustrates a corresponding structure.

As shown in FIG. 4, a substrate 200 is provided. A well region 201 may be formed in the substrate 200.

The substrate 200 may be made of any appropriate materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof, or glass, etc. The substrate 200 provides a base for subsequent devices and processes.

The well region 201 may be doped with a first type of doping ions. In one embodiment, the first type is N-type. A bit line region and a source region may be subsequently formed in the well region 201; and the bit line region and the source region may be doped with P-type ions. In certain other embodiments, the well region 201 may be doped with P-type ions.

The process for forming the well region 201 may include forming a first patterned layer on the surface of the substrate 200. The first patterned layer may expose a portion of the surface of the substrate 200 corresponding to the well region 201. Then, an ion implantation process may be performed on the exposed surface of the substrate 200 using the first patterned layer as a mask. Thus, the well region 201 may be formed in the surface of the substrate 200.

The first patterned layer may be a patterned photoresist layer. The process for forming the first patterned layer may include forming a photoresist layer on the surface of the substrate 200; and exposing and developing the photoresist layer to form the patterned photoresist layer (the first patterned layer). After forming the well region 201, the first patterned layer may be removed by any appropriate process, such as a dry etching process, a wet etching process, or a plasma ashing process, etc.

Figure 5:
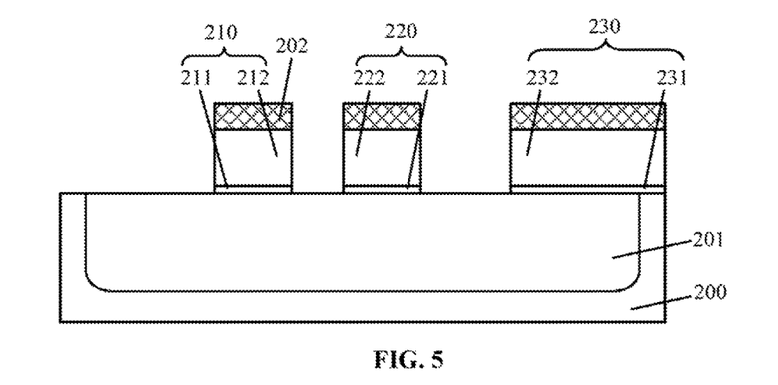

Returning to FIG. 12, after forming the well region 201, a select gate structure, a floating gate structure and a dummy gate structure may be formed on the surface of the substrate 200 (S102). FIG. 5 illustrates a corresponding semiconductor structure.

As shown in FIG. 5, a select gate structure 210, a floating gate structure 220 and a dummy gate structure 230 are formed on the surface of the substrate 200 in the well region 201, respectively. The select gate structure 210 and the dummy gate structure 230 may be disposed at the two sides of the floating gate structure 220, respectively.

The select gate structure 210 may be configured as the select gate of the memory cell. The floating gate structure 220 may be configured as the floating gate of the memory cell.

The dummy gate structure 230 may be used to control the positions and shapes of the subsequently formed lightly doped region and source region to ensure the source region to be entirely enclosed by the lightly doped region. By doing so, the source region may not directly contact with the well region 201. Thus, the leakage current generated by the breakdown between the well region 201 and the source region may be avoided.

In one embodiment, the select gate structure 210 may include a select gate dielectric layer 211 formed on the surface of the well region 201; and a select gate electrode layer 212 formed on the select gate dielectric layer 211. The floating gate structure 220 may include a floating gate dielectric layer 221 formed on the surface of the well region 221; and a floating gate electrode layer 222 formed on the floating gate dielectric layer 221. The dummy gate structure 230 may include a dummy gate dielectric layer 231 formed on the surface of the well region 201; and a dummy gate electrode layer 232 formed on the dummy gate dielectric layer 231.

Further, a mask layer 202 may be on the surface of the select gate electrode layer 212, the floating gate electrode layer 222 and the dummy gate electrode layer 232. The mask layer 202 may be used as a mask layer for forming the select gate structure 210, the floating gate structure 220 and the dummy gate structure 230 by an etching process. The mask layer 202 may also be used to protect the select gate electrode layer 212, the floating gate electrode layer 222 and the dummy gate electrode layer 232.

The process for forming the select gate structure 210, the floating gate structure 220 and the dummy gate structure 230 may include forming a gate dielectric material layer on the surface of the substrate 200; forming a gate electrode material layer on the surface of the gate dielectric material layer; forming the mask layer 202 covering the portions of the gate electrode material layer corresponding to the select gate structure 210, the floating gate structure 220 and the dummy gate structure 230 on the surface of the gate electrode material layer; and etching the gate electrode material layer and the gate dielectric material layer until the surface of the substrate 200 is exposed using the mask layer 202 as an etching mask. Thus, the select gate structure 210, the floating gate structure 220 and the dummy gate structure 230 may be formed.

Because the select gate structure 210, the floating gate structure 220 and the dummy gate structure 230 may be formed simultaneously, no extra step may be needed to form the dummy gate structure 230. Thus, the fabrication process may be simplified.

The gate dielectric material layer may be made of any appropriate material, such as one or more of silicon oxide, silicon nitride, or silicon oxynitride, etc. Various processes may be used to form the gate dielectric material layer, such as a chemical vapor deposition (CVD) process, a physical vapor deposition (PVD) process, or an atomic layer deposition (ALD) process, etc. If the gate dielectric material layer is made of silicon oxide and the substrate 200 is made of silicon, the gate dielectric material layer may also be formed by a thermal oxidation process, or a wet oxidation process, etc.

The gate electrode material layer may be made of any appropriate material, such as polysilicon, or metal material, etc. In one embodiment, the gate electrode material layer is made of polysilicon.

Various processes may be used to form the gate electrode material layer, such as a CVD process, a PVD process, or an ALD process, etc. In one embodiment, the gate electrode material layer is formed by a CVD process.

The mask layer 202 may be made of any appropriate material, such as silicon nitride, silicon oxynitride, titanium nitride, tantalum nitride or amorphous carbon, etc. In one embodiment, the mask layer 202 may be a hard mask layer. The hard mask layer may keep the patterns stable during the etching process; and may be able to protect the select gate electrode layer 212, the floating gate electrode layer 222 and the dummy gate electrode layer 232 during the subsequent processes.

The process for forming the mask layer 202 may include forming a hard mask material layer on the surface of the gate electrode material layer, forming a second patterned layer covering portions the hard mask material layer corresponding to the positions and shapes of the select gate structure 210, the floating gate structure 220 and the dummy gate structure 230 on the surface of the hard mask material layer; and etching the hard mask material layer until the surface of the gate electrode material layer is exposed. Thus, the mask layer 202 may be formed.

The second patterned layer may be removed after forming the mask layer 202, or after etching the gate dielectric material layer and the gate electrode material layer. In one embodiment, the second patterned layer is a patterned photoresist layer. The process for forming the patterned photoresist layer may include forming a photoresist layer on the surface of the mask material layer by a spin-coating process; and exposing and developing the photoresist layer.

The gate dielectric material layer and the gate electrode material layer may be etched by any appropriate process, such as a dry etching process, or a wet etching process, etc. In one embodiment, an anisotropic dry etching process is used to etch the gate electrode material layer and the gate dielectric material layer. The etching direction may be perpendicular to the surface of the substrate 200.

The etching gas of the dry etching process for etching the gate electrode material layer may include $Cl_2$, HBr, or a mixture of $Cl_2$ and HBr, etc. The flow rate of HBr may be in a range of approximately 200 sccm-800 sccm. The flow rate of $Cl_2$ may be in a range of approximately 20 sccm-100 sccm. The flow rate of an inert gas, i.e., the carrier gas, may be in a range of approximately 50 sccm-1000 sccm. The pressure of the chamber of the dry etching process may be in a range of approximately 2 mTorr-200 mTorr.

In one embodiment, the gate dielectric material layer is made of silicon oxide. The etching gas of the dry etching process for etching the gate dielectric material layer may include carbon fluoride gas, such as $CHF_3$, etc.

Figure 6:
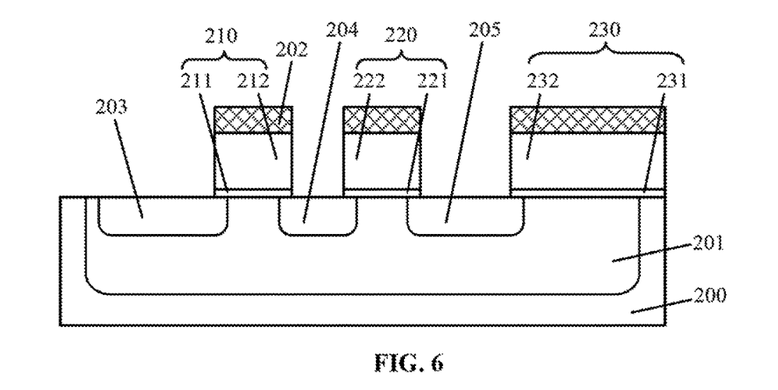

Referring to FIG. 6, in one embodiment, a portion of the dummy gate structure 230 may be on the surface of the well region 201, and the other portion of the dummy gate structure 230 may be on the surface of the substrate 200 outside the well region 201. The distance between the select gate structure 210 and the floating gate structure 220 may be smaller than the distance between the floating gate structure 220 and the dummy gate structure 230. After subsequently forming sidewalls, such a geometry may cause the sidewalls to cover the entire surface of the substrate 200 between the select gate structure 210 and the floating gate structure 220, and expose a portion of the surface of the substrate 200 between the floating gate structure 220 and the dummy gate structure 230.

Further, to cause the subsequently formed sidewalls to be able to cover the entire surface of the substrate 200 between the select gate structure 210 and the floating gate structure 220, the distance between the select gate structure 210 and the floating gate structure 220 may be smaller than twice of the thickness of the sidewalls.

Returning to FIG. 12, after forming the select gate structure 210, the floating gate structure 220 and the dummy gate structure 230, a first lightly doped region, a second lightly doped region and a third lightly doped region may be formed (S103). FIG. 6 illustrates a corresponding structure.

As shown in FIG. 6, a first lightly doped region 203, a second lightly doped region 204 and a third lightly doped region 205 are formed in the substrate 200 in the well region 201. The first lightly doped region 203 and the second lightly doped region 204 may be at the two sides of the select gate structure 210; and the second lightly doped region 204 may be in between the select gate structure 210 and the floating gate structure 220. Further, the third lightly doped region 205 may be in the between the floating gate structure 220 and the dummy gate structure 230.

The doping type of the first lightly doped region 203, the doping type of the second lightly doped region 204 and the doping type of the third lightly doped region 205 may be identical. Further, the doping type of the first lightly doped region 203, the second lightly doped region 204 and the third lightly doped region 205 may be opposite to the doping type of the well region 201. In one embodiment, the doping type of the first lightly doped region 203, the second lightly doped region 204 and the doping type of the third lightly doped region 205 is a second type. The second type may be opposite to the first type. For example, if the first type is N-type, the second type may be P-type. If the first type is P-type, the second type may be N-type.

In one embodiment, the well region 201 is doped with the N-type doping ions. Thus, the first lightly doped region 203, the second lightly doped region 204 and the third lightly doped region 205 are doped with P type ions; and the first lightly doped region 203, the second lightly doped region 204 and the third lightly doped region 205 may be referred to as PLDD regions.

The process for forming the first lightly doped region 203, the second lightly doped region 204 and the third lightly doped region 205 may include forming a third patterned layer exposing the select gate structure 210, the floating gate structure 220, the dummy gate structure 230 and portions of the surface of the well region 201 corresponding to the first lightly doped region 203, the second lightly doped region 204 and the third lightly doped region 205 on the surface of the substrate 200; and performing a first ion implantation process on the well region 201 using the third patterned layer as a mask. Thus, the first lightly doped region 203, the second lightly doped region 204 and the third lightly doped region 205 may be formed. During the first ion implantation process, the mask layer 202 may be able to protect the select gate electrode layer 212, the floating gate electrode layer 222 and the dummy gate electrode layer 232.

Figure 7:
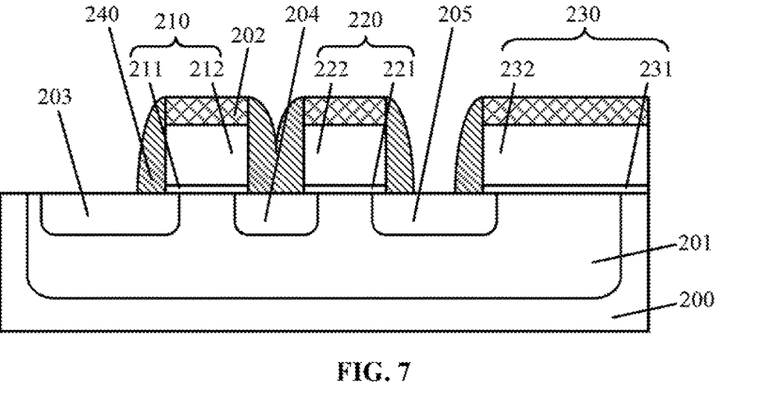

Returning to FIG. 12, after forming the first lightly doped region 203, the second lightly doped region 204 and the third lightly doped region 205, sidewalls may be formed (S104). FIG. 7 illustrates a corresponding structure.

As shown in FIG. 7, sidewalls 240 are formed on the side surfaces of the select gate structure 210, the floating gate structure 220 and the dummy gate structure 230, and on portions of the surface of the substrate 200. The sidewalls 240 between the select gate structure 210 and the floating gate structure 220 may cover the entire surface of the second lightly doped region 204, i.e., the portion of the surface of the substrate 200 between the select gate structure 210 and the floating gate structure 220.

The sidewalls 240 may be used to protect the side surfaces of the select gate structure 210, the floating gate structure 220 and the dummy gate structure 230. Further, the sidewalls 240 may also be used as an electric isolation structure between the subsequently formed first conductive layer and the select gate structure 210, the floating gate structure 220 and the dummy gate structure 230. Further, the sidewalls 240 may also be used to define the distance between the subsequently formed bit line region and the select gate structure 210 and the distances between the subsequently formed source region and the floating gate structure 220 and the dummy gate structure 230.

In one embodiment, the dummy gate structure 230 may be formed on the substrate 200 at one side of the floating gate 220, the sidewalls 240 may also be formed on the side surfaces of the dummy gate 230. Thus, the exposed region between the floating gate structure 220 and the dummy gate structure 230 may be within the third lightly doped region 205. Accordingly, the subsequently formed source region may be also within the third lightly doped region 205. Thus, the portion of the third lightly doped region 205 between the source region and the well region 201 may be used as a transitional structure, i.e., the source region may not contact the well region 201 directly. The transitional structure may be able to prevent the leakage current.

The process for forming the sidewalls 240 may include forming a sidewall material layer on the surface of the substrate 200, the side and the top surfaces of the select gate structure 210, the top and the side surfaces of the floating gate structure 220 and the top and side surfaces of the dummy gate structure 230; and performing an etch-back process until the surface of the substrate 200, the top surface of the select gate structure 210, the top surface of the floating gate structure 220 and the top surface of the dummy gate structure 210 are exposed. Thus, the sidewalls 240 may be formed.

The sidewall material layer may be made of any appropriate material, such as one or more of silicon oxide, silicon nitride, and silicon oxynitride, etc. The thickness of the sidewall material layer may be in a range of approximately 400 Å-600 Å. In one embodiment, the thickness of the sidewalls 240 is approximately 500 Å. Various processes may be used to form the sidewall material layer, such as a CVD process, a PVD process, or an ALD process, etc.

In one embodiment, the sidewall material layer is formed by an ALD process. The precursor gas of the ALD process may include a silicon-containing gas, and one or more of an oxygen-containing gas and a nitrogen-containing gas, etc. The temperature of the ALD process may be in a range of approximately 400° C.–600° C. The pressure of the ALD process may be in a range of approximately 1 mTorr-10 mTorr. The flow rate of the precursor gas may be in a range of the approximately 1500 sccm-4000 sccm. The deposition cycle may be in a range of approximately 15 times-50 times.

The sidewall material layer may fill the gap between the select gate structure 210 and the floating gate structure 220. Thus, the sidewalls 240 between the select gate structure 210 and the floating gate structure 220 may cover the entire surface of the well region 201 between the select gate structure 210 and the floating gate structure 220. When an ion implantation process is subsequently performed to form a bit line region and a source region, the well region 201 between the select gate structure 210 and the floating gate structure 220 may not be doped.

Further, to ensure the sidewall material to be able to fill the gate between the select gate structure 210 and the floating gate structure 220 the distance between the select gate structure 210 and the floating gate structure 220 may be smaller than twice of the thickness of the sidewall material layer may be greater than Further, the distance between the floating gate structure 220 and the dummy gate structure 230 may be greater than the distance between the select gate structure 210 and the floating gate structure 220. Thus, when the gap between the select gate structure 210 and the floating gate structure 220 is filled, a portion of the surface of the third lightly doped region 205 between the floating gate structure 220 and the dummy gate structure 230 may be exposed. That is, the portion of surface of the third lightly doped region 205 between the floating gate structure 220 and the dummy gate structure 230 may be exposed by the sidewalls 240. Thus, the source region subsequently formed by an ion implantation process may be within the third lightly doped region 205; and enclosed by the third lightly doped region 205.

The etch-back process may be any appropriate etching process. In one embodiment, an anisotropic dry etching process is used as the etch-back process. The etching gas of the anisotropic dry etching process may include one or more of carbon fluoride gas, $O_2$, Ar, He, and $N_2$, etc. The flow rate of the etching gas may be in a range of approximately 50 sccm-1000 sccm. The pressure of the etching chamber may be in a range of approximately 1 mTorr-50 mTorr. The bias voltage of the anisotropic dry etching process may be in a range of approximately 10 V-800 V. The power of the anisotropic dry etching process may be in a range of approximately 100 W-800 W. The temperature of the anisotropic dry etching process may be in a range of approximately 40° C.-200° C. The carbon fluoride gas may include one or more of $CF_4$, $C_3F_8$, $C_4F_8$, $CH_2F_2$, $CH_3F$ and $CHF_3$, etc.

Figure 8:
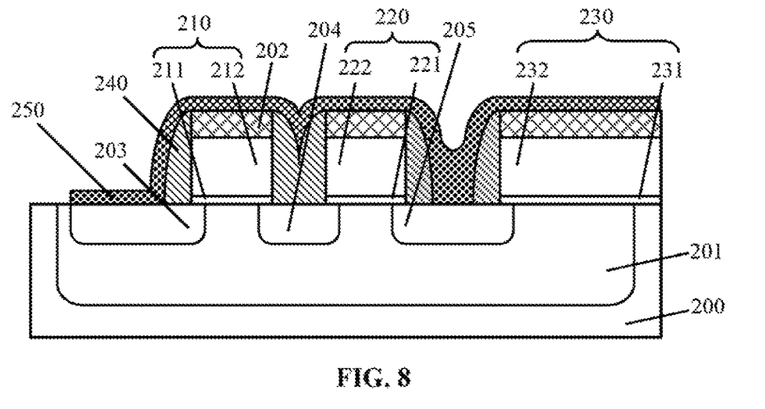

Returning to FIG. 12, after forming the sidewalls 240, a conductive film may be formed (S105). FIG. 8 illustrates a corresponding semiconductor structure.

As shown in FIG. 8, a conductive film 250 is formed on the surfaces of the first lightly doped region 203, the sidewalls 240, the select gate structure 210, the floating gate structure 220, the third lightly doped region 205, and the dummy gate structure 230. The conductive film 250 may be used to subsequently form a first conductive layer.

Because a bit line region may be subsequently formed in the first lightly doped region 203; and a source region may be subsequently formed in the third lightly doped region 205, the first connective layer may be on the surfaces of the bit line region and the source region. In certain other embodiments, the conducive film may be formed after forming a bit line region and a source region.

The conductive film 250 may be made of any appropriate material. In one embodiment, the conductive film 250 is made of polysilicon. The subsequent ion implantation processes may dope the conductive film 250 simultaneously; and may cause the polysilicon film to be conductive.

The thickness of the conductive film 250 may be in a range of approximately 600 Å-700 Å. In one embodiment, the thickness of the conductive film 250 is approximately 650 Å. The conductive layer 250 may need to fill the gap between the floating gate 220 and the dummy gate 230 such that the subsequently formed first conductive layer may be able to apply a bias voltage to the subsequently formed source region.

Further, because the thickness of the portion of the conductive film 250 may be relatively large, the thickness of the subsequently formed first conductive layer may also be relatively large. Thus, the resistivity of the first conductive layer may be relatively small; and the working current may be increased. Accordingly, the efficiency of the memory cell may be enhanced; and the power consumption may be decreased.

Further, because the conductive film 250 may fill the gap between the floating gate structure 220 and the dummy gate structure 230, the thickness of the portion of the conductive film 250 on the first lightly doped region 203 may be smaller than the thickness of the portion of the conductive film 250 on the third lightly doped region 205. During the subsequent process for forming the bit line region and the source region, due to the barrier function of the conductive film 250, the depth of the source region may be smaller than the depth of the bit line region. That is, a graded junction may be formed. Thus, the source region may be enclosed by the third lightly doped region 205; and the direct contact between the source region and the well region 201 may be avoided.

Various processes may be used to form the conductive film 250, such as a CVD process, a PVD process, or an ALD process, etc. In one embodiment, a high temperature furnace CVD process is used to form the conductive film 250. The temperature of the CVD process may be in a range of approximately 600° C.-800° C. The precursor gas of the CVD process may include $SiH_2Cl_2$, etc. In one embodiment, after forming the conductive film 250, the portion of the conductive film 250 outside of the well region 201 may be removed.

Figure 9:
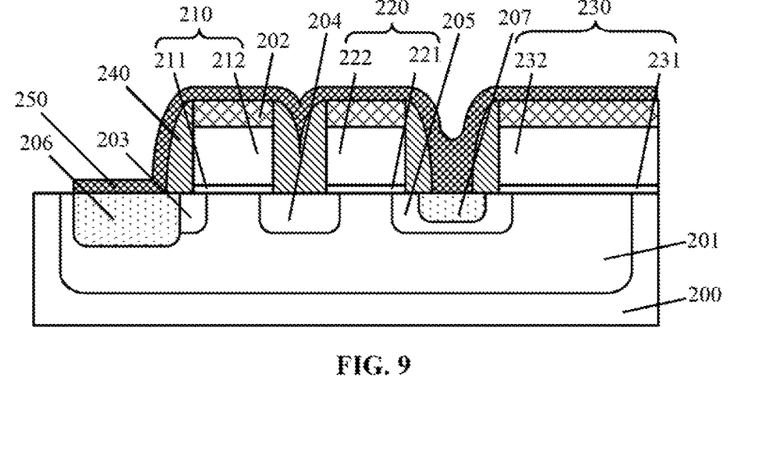

Returning to FIG. 12, after forming the conductive film 250, a bit line region and a source region may be formed (S106). FIG. 9 illustrates a corresponding structure.

As shown in FIG. 9, a bit line region 206 is formed in the first lightly doped region 203; and a source region 207 is formed in the third lightly doped region 205. The third lightly doped region 205 may enclose the source region 207, i.e., the source region 207 may not directly contact with the well region 201.

The bit line region 206 and the source region 207 may be doped with a same type of doping ions, e.g., a second type of doping ions. The doping type of the bit line region 206 and the source region 207 may be opposite to the doping type of the well region 201; and may be identical to the doping type of the first lightly doped region 203, the second lightly doped region 204 and the third lightly doped region 205. In one embodiment, the bit line region 206 and the source region 207 are doped with P-type ions. The doping concentration of the bit line region 206 and the source region 207 may be greater than the doping concentration of the first lightly doped region 203, the second lightly doped region 204 and the third lightly doped region 205.

The process for forming the bit line region 206 and the source region 207 may include forming a fourth patterned layer exposing the regions corresponding to the select gate structure 210, the floating gate structure 220, the dummy gate structure 230, the first lightly doped region 203, the second lightly doped region 204 and the third lightly doped region 205 on the conductive film 250; and performing a second ion implantation process using the fourth patterned layer as a mask. Thus, the bit line region 206 may be formed in the first lightly doped region 203; and the source region 207 may be formed in the third lightly doped region 205.

In one embodiment, because the thickness of the portion of the conductive layer 250 on third lightly doped region 205 may be greater than the thickness of the portion of the conductive layer 250 on the first lightly doped region 202, the depth of the bit line region 206 may be greater than the depth of the source region 207. Further, because the edge of the third lightly doped region 205 may be covered by the sidewalls 250, the source region 207 may be in the middle of the third lightly doped region 205; and may be enclosed by the third lightly doped region 205. Thus, the source region 207 may not directly contact with the well region 201. That is, a graded junction may be formed. Accordingly, the breakdown issue between the source region 207 and the well region 201 caused by the significantly high doping concentration difference may be avoided. Therefore, the leakage current between the source region 207 and the well region 201 may be prevented; and the performance of the memory cell may be improved.

In one embodiment, the mask layer 202 may be formed on the top surface of the select gate electrode layer 212, the floating gate electrode layer 222 and the dummy gate electrode layer 232, during the second ion implantation process, the mask layer 202 may be able to protect the select gate electrode layer 212, the floating electrode layer 222 and the dummy gate electrode layer 232; and prevent the second type of doping ions from entering into the select gate structure 210, the floating gate structure 220 and the dummy gate structure 230.

Returning to FIG. 12, after forming the bit line region 206 and the source region 207, a dielectric layer, a first conductive layer and conductive vias may be formed (S107). FIGS. 10-11 illustrate a corresponding structure. FIG. 11 is a top view of the structure illustrated in FIG. 10 with "260" being omitted.

As shown in FIGS. 10-11, a first conductive layer 250a is formed by patterning the conductive film 250. Further, a dielectric layer 260 may be formed on the surface of the substrate 200 and the surface of the first conductive layer 250a. Further, conductive vias 270 may be formed on the first conductive layer 250a and in the dielectric layer 260.

The first conductive layer 250a may be formed by removing portions of the conductive film 250 on the top surface of the select gate structure 210, the top surface of the floating gate structure 220 and the top surface of the dummy gate 230. Specifically, the process for removing the portions of the conductive film 250 on the top surface of the select gate structure 210, the top surface of the floating gate structure 220 and the top surface of the dummy gate structure 230 may include forming the dielectric layer 260 exposing portions of conductive film 250 on the top surface of the select gate structure 210, the top surface of the floating gate structure 220 and the top surface of the dummy gate structure 230 on the conductive film 250; and removing the exposed portions of conductive film 250 on the top surface of the select gate structure 210, the top surface of the floating structure 220 and the top surface of the dummy gate structure 230 on the conductive film 250. Thus, the first conductive layer 250a may be formed.

The process for forming the dielectric layer 260 may include forming a dielectric material layer on the conductive film 250; and planarizing the dielectric material layer until the portions of conductive film 250 on the top surface of the select gate structure 210, the top surface of the floating gate structure 220 and the top surface of the dummy gate structure 230 on the conductive film 250 are exposed. Thus, the dielectric layer 260 may be formed.

The dielectric layer 260 may be made of any appropriate material, such as one or more silicon oxide, silicon nitride, silicon oxynitride, low-K dielectric material (i.e., the dielectric constant is in a range of approximately 2.5-3.9) and ultra-low-K dielectric material (i.e., the dielectric constant is lower than 2.5). Various processes may be used to form the dielectric material layer, such as a CVD process, a PVD process, or an ALD process, etc.

The portions of the conductive film 250 on the top surface of the select gate structure 210, the top surface of the floating gate structure 220 and the top surface of the dummy gate structure 230 may be removed by any appropriate process, such as an etching process, etc. The etching process may be an isotropic dry etching process or wet etching process.

The dielectric material layer may be planarized by any appropriate process, such as a chemical mechanical polishing process. The chemical mechanical polishing process may also be used to remove the portions of conductive film 250 on the top surface of the select gate structure 210, the top surface of the floating gate structure 220 and the top surface of the dummy gate structure 230. That is, the chemical mechanical polishing process may be used to planarize the dielectric film until the mask layer 202 is exposed.

In one embodiment, after forming the dielectric layer 260, the mask layer 202 may be removed. The mask layer 202 may be removed by any appropriate process, such as a dry etching process, or a wet etching process, etc.

In one embodiment, a second conductive layer (not shown) may be formed on the surface of the floating gate structure 220. The process for forming the second conductive layer may include removing a portion of the mask layer 202 to expose a portion of the floating gate electrode layer 222 before forming the conductive layer 250; and forming the conductive film on the exposed surface of the floating gate electrode layer 222. When the conductive layer 250 is patterned to form the first conductive 250a, the portion of the conductive film 250 on the floating gate electrode layer 222 may be kept to be configured as the second conductive layer.

After forming the dielectric layer 260, conductive vias 270 may be formed in the dielectric layer 260. The process for forming the conductive vias 270 may include forming a fifth patterned layer exposing the portions of the surface of the dielectric layer 260 corresponding to the conductive vias 270 on the surface of the dielectric layer 260; etching the dielectric layer 260 until the surface of the first conductive layer 250a is exposed using the fifth patterned layer as an etching mask to form through-holes; forming a conductive material layer on the surface of the dielectric layer 260 and in the through-holes; and planarizing the conductive material layer until the surface of the dielectric layer 260 is exposed. Thus, the conductive vias 270 may be formed. The conducive vias 270 may electrically connect with the first conductive layer 250a and the second conductive layer. In one embodiment, the conductive via 270 electrically connected with the bit line region 206 may be disposed at a region outside of the first conductive layer 250a in the third lightly doped region 205.

Thus, a memory cell structure may be formed by the above disclosed processes and methods; and FIGS. 10-11 illustrate a corresponding memory cell structure. As shown in FIGS. 10-11. The memory cell structure includes a substrate 200; and a well region 201 formed in the substrate 200. The memory cell structure may also include a select gate structure 210, a floating gate structure 220 and a dummy gate structure 230 formed on the surface of the substrate 200 in the well region 201. The select gate structure 210 and the dummy gate structure 230 may be at the two sides of the floating gate structure 220, respectively. Further, the memory cell structure may include a first lightly doped region 203, a second lightly doped region 204 and a third lightly doped region 205 formed in the well region 201 in the substrate 200. The first lightly doped region 203 and the second lightly doped region 204 may be at the two sides of the select gate structure 210, respectively; and the second lightly doped region 204 may be in between the select gate structure 210 and the floating gate structure 220. The third lightly doped region 205 may be in between the floating gate structure 220 and the dummy gate structure 230. Further, the memory cell structure may also include sidewalls 204 formed on the side surfaces of the select gate structure 210, the floating gate structure 220 and the dummy gate structure 240. Further, the memory cell structure may include a bit line region 206 formed in the first lightly doped region 203; and a source region 207 formed in the third lightly doped region 205. The third lightly doped region 205 may enclose the source region 207. Further, the memory cell structure may also include a first conductive layer 250a formed on the portions of the surfaces of the first lightly doped region 203 and the third lightly doped region 205 exposed by the select gate structure 210, the floating gate structure 220, the dummy gate structure 230 and the sidewalls 240; and conductive vias 270 formed on the surface of the first conductive layer 250a. The detailed structures and intermediate structures are described above with respect to the fabrication processes.

Thus, according to the disclosed embodiments, a select gate structure and a dummy gate structure may be disposed at the two sides of the floating gate structure respectively; and sidewalls may also be formed on the side surfaces of the dummy gate structure. Because the third lightly doped region may be in the well region between the floating gate structure and the dummy gate structure, and the source region may be in the well region exposed by the floating gate structure, the dummy gate structure and the sidewalls, the source region may be within the third lightly doped region; and may be enclosed by the third lightly doped region.

Further, because a portion of the third lightly doped region may be used as a transitional structure between the source region and the well region, the source region may not directly contact with the well region. Thus, the breakdown phenomenon between the source region and the well region may be inhibited. Accordingly, the leakage current between the source region and the well region may be reduced; and the performance of the memory cell may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a memory cell, comprising:
   providing a substrate having a surface;
   forming a well region in the surface of the substrate;
   forming a select gate structure, a floating gate structure and a dummy gate structure on the surface of the substrate in the well region with the select gate structure and the dummy gate structure being at the two sides of the floating gate structure, respectively;
   forming a first lightly doped region, a second lightly doped region and a third lightly doped region in the well region with the first lightly doped region and the second lightly doped region being at two sides of the select gate structure respectively, the second lightly doped region being in between the select gate structure and the floating gate structure, and the third lightly doped region being in between the floating gate structure and the dummy gate structure; and
   forming a bit line region in the first lightly doped region and a source region in the third lightly doped region with the source region being isolated from the well region by the third lightly doped region.

2. The method according to claim 1, wherein:
   the well region is doped with a first type of doping ions; and
   the first lightly doped region, the second lightly doped region, the third lightly doped region, the bit line region and the source region are doped with a second type of doping ions opposite to the first type of doping ions.

3. The method according to claim 2, wherein:
   a doping concentration of the second type of doping ions in the bit line region and the source region is greater than a doping concentration of the second type of doping ions in the first lightly doped region, the second lightly doped region, and the third lightly doped region.

4. The method according to claim 2, wherein:
   the first type of doping ions are N-type ions; and
   the second type of doping ions are P-type ions.

5. The method according to claim 1, after forming the first lightly doped region,
   the second lightly doped region and the third lightly doped region, further comprising:
   forming a sidewall material film on the surface of the substrate, side and top surfaces of the select gate structure, the floating gate structure and the dummy gate structure; and
   etching back the sidewall material film until the surface of the substrate, and the top surfaces of the select gate structure, the floating gate structure and the dummy gate structure are exposed to form sidewalls on side surfaces of the select gate structure, the floating gate structure and the dummy gate structure and portions of the surfaces of the substrate.

6. The method according to claim 5, wherein:
   the sidewalls between the floating gate structure and the dummy gate structure exposes a portion of the surface of the substrate between the floating gate structure and the dummy gate structure.

7. The method according to claim 1, before forming the bit line region and the source region, further comprising:
   forming a conductive film on surfaces of the first lightly doped region, the sidewalls, the select gate structure, the floating gate structure, the third lightly doped region; and
   removing portions of the conductive film on tops of the select gate structure, the floating gate structure and the dummy gate structure to form a first conductive layer.

8. The method according to claim 1, after forming the bit line region and the source region, further comprising:
   forming a conductive film on surfaces of the first lightly doped region, the sidewalls, the select gate structure, the floating gate structure, the third lightly doped region; and
   removing portions of the conductive layer on tops of the select gate structure, the floating gate structure and the dummy gate structure to form a first conductive layer.

9. The method according to claim 1, wherein:
   the bit line region and the source region are formed by an ion implantation process.

10. The method according to claim 1, wherein forming the select gate structure, the floating gate structure and the dummy gate structure comprises:
    forming a gate dielectric material layer on the surface of the substrate;
    forming a gate electrode material layer on the gate dielectric material layer;
    forming a mask layer covering portions of a surface of the gate electrode material layer corresponding to the select gate structure, the floating gate structure and the dummy gate structure; and
    etching the gate dielectric material layer and the gate electrode material layer using the mask layer as an etching mask until the surface of the substrate is exposed.

11. The method according to claim 10, after forming the bit line region and the source region, further comprising:
    removing the mask layer.

12. The method according to claim 10, further comprising:
    forming a second conductive layer on the surface of the floating gate structure.

13. The method according to claim 1, wherein:
    the first lightly doped region, the second lightly doped region and the third lightly doped region are formed by an ion implantation process.

14. A method for fabricating a memory cell, comprising:
    providing a substrate having a surface;
    forming a well region in the surface of the substrate;
    forming a select gate structure, a floating gate structure and a dummy gate structure on the surface of the substrate in the well region with the select gate structure and the dummy gate structure being at the two sides of the floating gate structure, respectively, wherein:
    sidewalls are formed on side surfaces of the select gate structure, the floating gate structure and the dummy gate structure and portions of the surfaces of the substrate and the sidewalls between the select gate structure and the floating gate structure covers the entire surface of the substrate between the select gate structure and the floating gate structure;
    forming a first lightly doped region, a second lightly doped region and a third lightly doped region in the well region with the first lightly doped region and the second lightly doped region being at two sides of the select gate structure respectively, the second lightly doped region being in between the select gate structure and the floating gate structure, and the third lightly doped region being in between the floating gate structure and the dummy gate structure; and forming a bit line region in the first lightly doped region and a source region in the third lightly doped region with the source region being enclosed by the third lightly doped region.

15. A memory cell, comprising:
a substrate having a surface;
a well region formed in the surface of the substrate;
a select gate structure, a floating gate structure and a dummy gate structure formed on the surface of the substrate in the well region with the floating gate structure and the dummy gate structure being at two sides of the floating gate structure, respectively;
a first lightly doped region, a second lightly doped region and a third lightly doped region formed in the well region with the first lightly doped region and the second lightly doped region being at the two sides of the select gate structure, respectively, the second lightly doped region being in between the select gate structure and the floating gate structure and the third lightly doped region being in between the floating gate structure and the dummy gate structure;
a bit line region formed in the first lightly doped region; and
a source region formed in the third lightly doped region with the source region being isolated from the well region by the third lightly doped region.

16. The memory cell according to claim 15, further comprising:
sidewalls formed on side surfaces of the select gate structure.

17. The memory cell according to claim 15, further comprising:
a first conductive layer formed on surfaces of the first lightly doped region and the third lightly doped region; and
conductive vias formed on the first conductive layer.

18. The memory cell according to claim 15, wherein:
the select gate structure includes a select gate dielectric layer formed on the surface of the substrate and a select gate electrode layer formed on the select gate dielectric layer;
the floating gate structure includes a floating gate dielectric layer formed on the surface of the substrate and a floating gate electrode layer formed on the floating gate dielectric layer; and
the dummy gate structure includes a dummy gate dielectric layer formed on the surface of the substrate and a dummy gate electrode layer formed on the dummy gate dielectric layer.

19. The memory cell according to claim 18, further comprising:
a second conductive layer formed on a portion of the floating gate electrode layer.

20. The memory cell according to claim 15, wherein:
the well region is doped with a first type of doping ions; and
the first lightly doped region, the second lightly doped region, the third lightly doped region, the bit line region and the source region are doped with a second type of doping ions opposite to the first type of doping ions.

* * * * *